(12) United States Patent
Ghosh et al.

(10) Patent No.: US 9,812,205 B2
(45) Date of Patent: Nov. 7, 2017

(54) MTJ-BASED CONTENT ADDRESSABLE MEMORY WITH MEASURED RESISTANCE ACROSS MATCHLINES

(71) Applicants: Swaroop Ghosh, Tampa, FL (US); Cheng Wei Lin, Seffner, FL (US)

(72) Inventors: Swaroop Ghosh, Tampa, FL (US); Cheng Wei Lin, Seffner, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 0 days.

(21) Appl. No.: 15/205,813

(22) Filed: Jul. 8, 2016

(65) Prior Publication Data
US 2017/0018308 A1     Jan. 19, 2017

Related U.S. Application Data

(60) Provisional application No. 62/192,794, filed on Jul. 15, 2015.

(51) Int. Cl.
| | |
|---|---|
| *G11C 15/00* | (2006.01) |
| *G11C 15/04* | (2006.01) |
| *G11C 15/02* | (2006.01) |
| *G11C 11/16* | (2006.01) |

(52) U.S. Cl.
CPC ............ *G11C 15/046* (2013.01); *G11C 15/02* (2013.01); *G11C 11/1675* (2013.01)

(58) Field of Classification Search
CPC ....... G11C 15/02; G11C 15/04; G11C 15/046; G11C 11/06; G11C 11/161; G11C 11/5607
USPC ........... 365/49.1, 49.17, 49.5, 148, 158, 171
See application file for complete search history.

(56) References Cited

U.S. PATENT DOCUMENTS

| | | | | |
|---|---|---|---|---|
| 9,230,649 | B2 * | 1/2016 | Chang | G11C 15/046 |
| 9,543,013 | B1 * | 1/2017 | Govindaraj | G11C 15/02 |
| 2009/0080239 | A1 * | 3/2009 | Nagase | H01L 27/228 365/158 |
| 2009/0109739 | A1 * | 4/2009 | Ranjan | G11C 11/14 365/171 |
| 2009/0243008 | A1 * | 10/2009 | Kitagawa | G11C 11/16 257/421 |
| 2010/0080050 | A1 * | 4/2010 | Ozeki | B82Y 25/00 365/158 |

OTHER PUBLICATIONS

Pagiamtzis, Kostas, et al., Content-Addressable Memory (CAM) Circuits and Architectures: A Tutorial and Survey, IEEE Journal of Solid-State Circuits, 2006, pp. 712-727, vol. 41, No. 3.

(Continued)

*Primary Examiner* — Gene Auduong
(74) *Attorney, Agent, or Firm* — Saliwanchik, Lloyd & Eisenschenk

(57) ABSTRACT

Embodiments of the subject invention provide a three transistor, two domain-wall-based magnetic tunnel junction CAM cell (3T-2DW-MTJ CAM). A four transistor, two magnetic tunnel junction ternary CAM cell (4T-2MTJ TCAM) is also provided. An array of the provided CAM cells forms words of various lengths, such as 4-bit, 8-bit, and 16-bit words. Longer CAM words can be formed by an array having hierarchical structures of CAM cells having smaller word sizes, such as 4-bit words or 8-bit words.

20 Claims, 12 Drawing Sheets

(56) References Cited

OTHER PUBLICATIONS

Shen, Weifeng, et al., Effect of film roughness in MgO-based magnetic tunnel junctions, AIP Applied Physics Letters 88, 2006, pp. 182508/1-182508/3,10.1063/1.2201547, AIP Publishing.

Xu, Wei, et al., Spin-Transfer Torque Magnetoresistive Content Addressable Memory (CAM) Cell Structure Design with Enhanced Search Noise Margin, IEEE, 2008, pp. 1898-1901, 978-1-4244-1684-4/08, ECSE Department, Rensselaer Polytechnic Institute, NY.

Nebashi, R. et al., A Content Addressable Memory Using Magnetic Domain Wall Motion Cells, Symposium on VLSI Circuits Digest of Technical Papers, 2011, pp. 300-301, 978-4-86348-165-7, 1NEC Corporation, Japan.

Zhang, Yue et al., Ultra-High Density Content Addressable Memory Based on Current Induced Domain Wall Motion in Magnetic Track, IEEE Transactions on Magnetics, 2012, pp. 3219-3222, vol. 48, No. 11, Impact Factor: 1.39 • DOI: 10.1109/TMAG.2012.2198876, https://www.researchgate.net/publication/25865688.

Venkatesan, Rangharajan, et al., DWM-TAPESTRI—An Energy Efficient All-Spin Cache using Domain wall Shift based Writes, EDAA, 2013, 978-3-9815370-0-0.

Schultz, K. et al., Fully-Parallel 25MHz 2.5Mb CAM, IEEE International Solid State Circuits Conference, 1998, pp. 332-333, 0-7803-4344-1/98, Nortel Semiconductors, Ottawa, Ontario, Canada.

Chung, Jinil et al., Domain Wall Memory based Digital Signal Processors for Area and Energy-Efficiency, DAC, 2015, ACM 978-1-4503-3520-1/15/06, http://dx.doi.org/10.1145/2744769.2744825, San Francisco, CA, USA.

Matsunagna, Shoun et al., Standby-Power-Free Compact Ternary Content-Addressable Memory Cell Chip Using Magnetic Tunnel Junction Devices, IOPscience, 2009, pp. 023004/1-023004/3, Applied Physics Express 2, http://iopscience.iop.org/1882-0786/2/2/023004.

Matsunagna, Shoun et al., Fine-Grained Power-Gating Scheme of a Metal-Oxide-Semiconductor and Magnetic-Tunnel-Junction-Hybrid Bit-Serial Ternary Content-Addressable Memory, IOP Science, 2010, pp. 04DM05/1-04DM05/5, Japanese Journal of Applied Physics 49, http://iopscience.iop.org/1347-4065/49/4S/04DM05.

Micheloni, Rino et al., Inside NAND Flash Memories, Springer Science+Business Media B.V. 2010, pp. 1-582, Springer Dordrecht Heidelberg London New York, www.springer.com.

Chaudhary, Vikas et al., Low-Power High-Performance NAND Match Line Content Addressable Memories, Ieee Transactions on Very Large Scale Integration (Vlsi) Systems, 2006, vol. 14, No. 8, pp. 895-905.

"Predictive Technology Model," Internet: http://ptm.asu.edu/, 1 page, available on or before Jul. 2, 2013, retrieved from Internet Archive Wayback Machine https://web.archive.org/web/20130702122817/http://ptm.asu.edu/ on Jun. 13, 2017.

* cited by examiner

MTJ-BASED CONTENT ADDRESSABLE MEMORY WITH MEASURED RESISTANCE ACROSS MATCHLINES

CROSS-REFERENCE TO RELATED APPLICATION

The present application claims the benefit of U.S. Provisional Application Ser. No. 62/192,794, filed Jul. 15, 2015, which is hereby incorporated by reference in its entirety, including any figures, tables, or drawings.

This invention was made with government support under Grant Number CNS-1441757 awarded by the National Science Foundation and with industry sponsorship under Grant No. SRC #2442 awarded by the Semiconductor Research Corporation. The U.S. government and the Semiconductor Research Corporation each has certain rights in the invention.

BACKGROUND OF THE INVENTION

Content Addressable Memory (CAM) is a memory tailored for search operations. It contains a dedicated comparison circuitry to search through a table of stored data within a single clock cycle [1]. The conventional CAM cell, also known as Binary CAM (BCAM), consists of a memory unit, typically SRAM, and a bit comparison circuitry. In Ternary Content Addressable Memory (TCAM), an additional memory unit is used to improve search speeds at the cost of larger area and power overheads.

The 8T NOR CAM cell [1] implements the comparison operation through the use of four transistors, M1 though M4. The two pairs of transistors, M1/M3 and M2/M4, create pulldown paths connecting the ML to the ground. The comparison operation begins by pre-charging ML. If a match between SL and D occur, both pulldown paths are OFF, disconnecting ML from the ground, and ML stays charged. If a miss between SL and D occurs, a pair of transistors will open and discharge ML. When multiple cells join in parallel to form a CAM word, ML discharges if any of the cells has a miss. The search speed is dictated by the discharge rate of ML. In the worst case, where only one miss occurs, ML can only discharge through a single cell, thus limiting the search speed.

The 9T NAND CAM cell [1] implements the comparison operation through two transistors (MD and \MD) and a pass transistor (M1). The search operation begins by applying a high or a low voltage to the SL and an opposite voltage to its complementary \SL. During a match, node B charges, either through MD or \MD depending on the values of D and SL, thus opening the pass transistor MP and allowing the current to discharge. During a miss, node B remains low and closes the MP. Multiple cells are joined in parallel to form a word by connecting the pass transistors in series. The search operation begins by precharging one end of the word. Match current can flow through the ML only if all of the cells have a match. Since the ML resistance is directly proportional to the word length, large word length reduces match current, restricting the search speed. Moreover, the NAND CAM has a potential charge-sharing issue at ML. When a pass transistor is ON the charge is shared by the adjacent intermediate ML nodes. Thus, in the case when all bits match except the last cell, the charges are shared by all the intermediate nodes till the last cell. The charge sharing may cause the pre-charged node to drop sufficiently to result in a false match. To prevent such an error, intermediate ML nodes are also precharged to VDD at the cost of extra area overhead and power dissipation.

To solve certain footprint, speed, and power challenges, nano-electronic CAMs have been explored. In [9], a novel TCAM cell design is presented by replacing volatile SRAM with Magnetic Tunnel Junction (MTJ) to achieve zero standby power consumption. The design consists of two access transistors and two MTJs. The MTJs (D1 and D2) are joined in parallel and connected with ML through the access transistors (M1 and M2). Each pair of MTJs and access transistors forms a pulldown path connecting ML to \ML. The stored data D in the cell is programmed by using two kinds of resistance in the two MTJs. A high resistance state represents a logic value of '0', and a low resistance state represents a logic value of '1'. Match or miss is determined based on the cell current with respect to the reference current. During a search operation the cells are evaluated sequentially. A word match is indicated only if all cells evaluate to a match. The advantages of the design are low area and zero standby power. The design only employs two transistors and two MTJs, therefore it is three times smaller than the conventional NOR CAM. The design was further improved to reduce active power consumption by power gating the row once a miss is found [10]. Other flavors such as [3] have also been proposed. However, the drawback includes low search speed (due to bit-by-bit evaluation) and potential errors (due to poor TMR and high variability). In addition, variations in the access transistor and wire resistance make sensing a challenge.

A Domain Wall (DW) based BCAM cell design was proposed in [4]. The design follows the conventional NOR CAM architecture for ultra-fast search operation, and replaces the SRAM with nonvolatile DW to eliminate standby-power. The cell design consists of two DW (R0 and \R0) and a dedicated comparison circuit. The comparison circuit is composed of a senseamp, four pulldown transistors (M1 through M4), and precharge and equalization transistors. Due to a difference in the resistance, the senseamp is biased to '1' or '0' depending on the data stored in R0. The search operation begins by precharging the ML. During match both pulldown paths stay OFF, disconnecting ML from the ground. During miss one pair of transistors opens (either M1/M3 or M2/M4) depending on the value of SL and D, and discharges ML. However, the design suffers from large area overhead induced by the dedicated sensing circuitry.

Another DWM CAM [5] employs a complimentary pair of magnetic nanowires that represent one word at a time to obtain the most reliable and fast access operation for CAM applications. The comparison circuit is designed based on a precharge sense amplifier. The CAM includes two MTJs connected together, forming the write heads. Due to the opposite directions of the write current pulse through these two MTJs, complementary polarities are nucleated in the nanowire. One of the critical challenges for complementary magnetic nanowires is to synchronize the domain wall positions. The current pulse is kept the same for both nanowires to solve this challenge. Identical physical notches are built in the nanowires to hold or pin the DWs and enable their synchronization. A pair of read MTJs are used for reading each bit of the storage element. This DWM CAM requires significant overhead from a CMOS sense circuit and the update operation is time intensive due to serial storage of data.

NAND flash memory typically contains stacked floating gate transistors that are used as a memory element. The information is stored in terms of a threshold voltage of the transistors. The presence or absence of charge on the floating gate corresponds to '1' or '0'. Programming is performed by applying appropriate voltage to the transistor gate. The threshold voltage of store '1' is less than 0V, whereas the threshold voltage is greater than 0V for store '0'. By stacking the bits vertically, NAND flash achieves very high density [12]. However the stacked design poses significant sensing challenges as the current difference between a '1' and a '0' state transistor is in the range of nano-amperes (nA).

The NAND sensing operation is based on the fact that the bitline (BL) capacitance discharges at different rates for transistors storing '1' and '0'. Sensing is reference-less. At the start of sensing the BL is precharged to VDD. Next the read voltage (typically 0V) is applied to selected transistor gate whereas the unselected transistors in the string are applied a pass voltage (typically 4-5V). The BL capacitor discharges if the stored value is '1'. Next a sense voltage ($V_{sen}$) is applied on SEL. The magnitude of the sense voltage is such that $V_{sen}-V_{BL}>V_{th}$ if the stored value is '1'. This turns ON the SEL transistor and discharges output SO. If the stored value is '0', the BL stays closer to the precharged value and the SEL transistor stays OFF. Therefore output SO stays at VDD. Note that sensing is slow to perform due to nA current ranges.

BRIEF SUMMARY OF THE INVENTION

In order to address the area overhead and sensing challenges of the prior art, CAM architectures are described in which the measured resistance across matchlines is different depending on whether a search match or mismatch condition is present.

Certain embodiments of the subject invention use a CAM cell including two domain-wall-based MTJs and three transistors.

Some embodiments of the subject invention use a CAM cell including two MTJs and four transistors.

Certain embodiments include an array of a plurality of the disclosed CAM cells that form words of various lengths, such as 4-bit, 8-bit, and 16-bit words.

In some embodiments, longer CAM words can be formed by an array using hierarchical structures of CAM cells having smaller word sizes, such as 4-bit word or 8-bit words.

DETAILED DISCLOSURE OF THE INVENTION

Figure 1A:
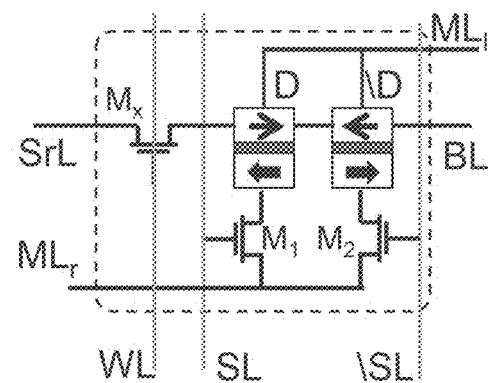
FIG. 1A shows an electrical schematic diagram of an embodiment of a CAM bitcell of the subject invention.

An embodiment of a 3T-2DW CAM bitcell is shown in FIG. 1A. The CAM contains two domain-wall-based MTJs (D and \D) and three transistors ($M_1$, $M_2$ and $M_x$). The CAM bitcell has searchlines (SL and \SL), wordline (WL), bitline (BL), sourceline (SrL) and matchlines ($ML_r$ and $ML_l$). The 3T-2DW CAM stores complementary bits in the MTJs.

Under this structure, a match results in high resistance, and a mismatch corresponds to low resistance. Thus, the proposed CAM allows binary CAM (BCAM) functionality. Write and search operations of the CAM bitcell are described below.

The write operation is performed by turning ON transistor $M_x$ and shifting the DWs in the MTJs using SrL and BL. A shift-based write as described in [6] is employed. The MTJs are connected to write complementary bits. The write polarity on MTJs is controlled by modulating the direction of current. A '0' is written by making (SrL, BL)=(1,0), whereas a '1' is written by making (SrL, BL)=(0,1). The searchline transistors $M_1$ and $M_2$ are kept OFF, which in turn isolates the CAM bitcell by disconnecting $ML_l$ and $ML_r$. Write speed is the time needed to shift the DW under the read MTJ, which is on the order of ~0.5 ns for a 10n×10n×10n nanowire [8].

The search operation is performed by turning OFF the write access transistor $M_x$ and putting the search value on SL and \SL. During match, a high resistance is connected between $ML_l$ and $ML_r$, and during mismatch, a low resistance is connected between $ML_l$ and $ML_r$.

Table 1 shows the state of components during write and search operations.

TABLE 1

| Op | WL | SrL | BL | SL | \SL |
|---|---|---|---|---|---|
| Write-0 | 1 | 1 | 0 | 0 | 0 |
| Write-1 | 1 | 0 | 1 | 0 | 0 |
| Search-0 | 0 | — | — | 0 | 1 |
| Search-1 | 0 | — | — | 1 | 0 |

Some embodiments of the disclosed CAM bitcell may be arranged in an array to form "words" of various bit lengths, such as 4-bit words, 8-bit words, and 16-bit words.

Figure 1B:
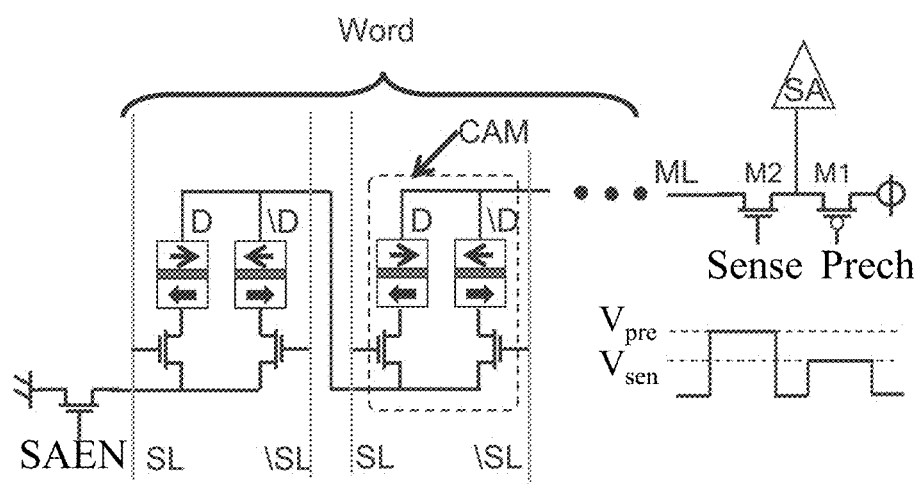
FIG. 1B shows an embodiment of a CAM bitcell array.
Figure 3A:
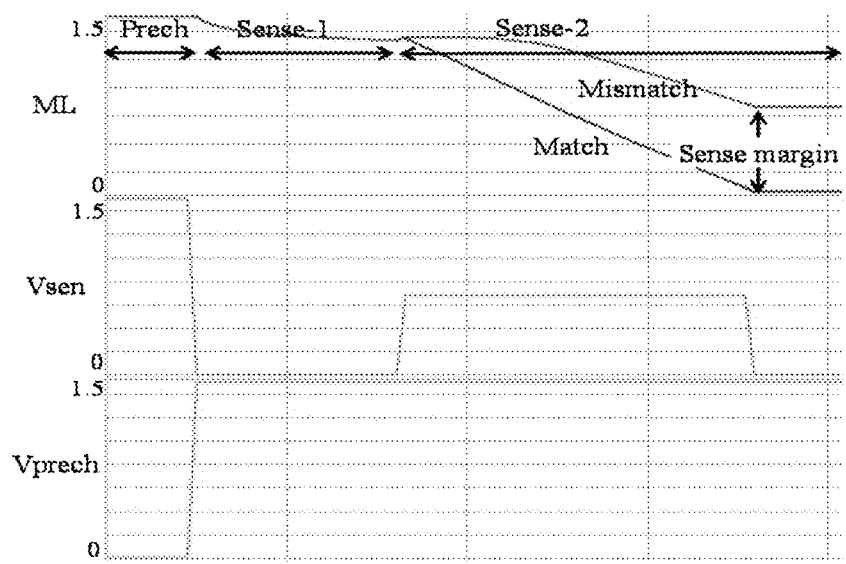
FIG. 3A shows a simulation waveform of a search operation.

FIG. 1B shows a single row of a BCAM array comprising the disclosed BCAM. The BCAM array in FIG. 1B includes a precharge transistor (Mp) on one end of a matchline and a search enable transistor (Ms) on the other end. A sense transistor (Msen) is connected between ML and an output node. The ML is precharged to VDD before search operations. The search begins by enabling the search transistor Ms and pulsing the sense transistor using voltage Vsen as shown in FIG. 3A. During full match the resistance of the ML stack is high, resulting in a lower discharge rate. Mismatch reduces the effective resistance of the ML, which increases the discharge rate. A very fine voltage difference between match and mismatch develops when Vsen is OFF (sense-1).

Once the ML discharges, depending on a match or mismatch, the sense transistor Msen is pulsed with second voltage Vsen.

The threshold voltage of the Msen and gate voltage Vsen is used to distinguish full match and one-bit mismatch for a robust sensing operation. During match the Msen turns ON and output discharges quickly. However, during mismatch, Msen turns OFF (or conducts weakly), discharging the output slowly. Consequently a sense margin develops between match and mismatch cases that can be sensed by a sense amplifier utilizing a reference voltage. The value of the reference voltage is between the match and mismatch voltages.

As will be shown in the examples, simple extension of the proposed CAM for larger word sizes can result in a poor sense margin and longer search speeds. Sometimes, hierarchical structures such as [7] [13] can be employed to make a trade-off between sense margin and search energy. Thus, in some embodiments, larger word sizes are implemented using hierarchical arrangements of smaller CAM words. For example, a 16-bit CAM can be realized either by using four 4-bit CAM segments or two 8-bit CAM segments.

In some of the disclosed CAM embodiments, the write operation is based on a DW shift and the CAM lacks ternary search capability. However, in certain embodiments of the subject invention, e.g., in absence of DW nanowires, the design can be modified to incorporate an MTJ and additional write circuitry. The circuitry can be adjusted to allow TCAM functionality.

Figure 2:
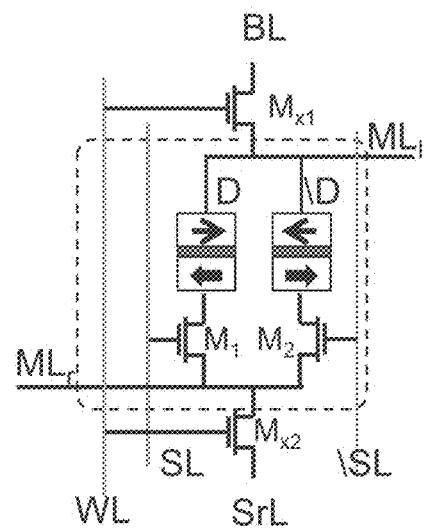
FIG. 2 shows an electrical schematic diagram of an embodiment of an MTJ-based TCAM bitcell of the subject invention.

FIG. 2 shows an example embodiment of a 4T-2MTJ TCAM bitcell. In FIG. 2, the DW nanowires are replaced by MTJs. The access transistor Mx is replaced by two new transistors $M_{x1}$ and $M_{x2}$. The peripheral contacts (SL, \SL, WL, BL, SrL, $ML_r$ and $ML_l$) are the same as those described in FIG. 1A. This CAM structure allows the storage of all possible combinations of values in MTJs. Therefore, TCAM functionality can be performed using the proposed CAM. Table 2 shows the write and search operations.

TABLE 2

| Op | WL | SrL | BL | SL | \SL | SAEN |
|---|---|---|---|---|---|---|
| Write-0 (D) | 1 | 1 | 0 | 1 | 0 | 0 |
| Write-0 (\D) | 1 | 0 | 1 | 0 | 1 | 0 |
| Write-1 (D) | 1 | 0 | 1 | 1 | 0 | 0 |
| Write-1 (\D) | 1 | 1 | 0 | 0 | 1 | 0 |
| Write-X (D&\D) | 1 | 0 | 1 | 1 | 1 | 0 |
| Search-0 | 0 | — | — | 0 | 1 | 1 |
| Search-1 | 0 | — | — | 1 | 0 | 1 |

The write operation is performed by turning ON write access transistors $M_{x1}$ and $M_{x2}$ and passing current in the required direction by controlling the potential of SrL and BL appropriately. The write polarity on an MTJ is controlled by modulating the direction of current. A '0' is written by making (SrL, BL)=(1,0) whereas a '1' is written by (SrL, BL)=(0,1). The searchline transistors $M_1$ and $M_2$ are turned ON one-by-one to write to MTJ1 and MTJ2 respectively. The matchlines $ML_l$ and $ML_r$ are disconnected from unselected neighboring cells by keeping their SL and \SL at '0'. Writing of 'X' is accomplished by turning both $M_1$ and $M_2$ ON and writing '1' in parallel. In the proposed architecture writing complementary values in MTJ1 and MTJ2 is done serially, whereas writing 'X' is done in parallel. Alternatively, the MTJs can be flipped with respect to each other to enable parallel writing of complementary bits and serial writing of 'X'. The write speed is the time needed to write to the MTJ, which is on the order of ~1 ns for an MTJ of dimension 10n×10n×10n [8].

The search operation is performed by turning OFF write access transistors $M_{x1}$ and $M_{x2}$ and putting the search value on SL and \SL. During match, a high resistance is formed between $ML_l$ and $ML_r$; during mismatch, a low resistance is connected between $ML_l$ and $ML_r$. The search delay and energy is expected to increase slightly due to the addition of extra diffusion capacitance from $M_{x1}$ and $M_{x2}$ on the matchline.

In certain embodiments, the search delay, search energy, and robustness of the disclosed 4T-2MTJ TCAM bitcell can be kept similar to the 3T-2DW CAM by using similar parameters for TMR, $R_L$ and transistor sizes $M_1$ and $M_2$.

Generally, the functionality of the disclosed CAM embodiments relate to resistance, Tunnel Magnetic Ratio (TMR), word size, temperature, and the variability of Msen.

The resistance dictates the rate at which the ML discharges, and the sensing time is expected to be directly proportional to the word length. Let's consider ML as a capacitor with capacitance, C, and the string of TCAM cells as a long chain of resistors R. Then, the proposed design can be simplified into an RC circuit, with a time constant of ~nRC, where n is the number of cells in the chain. (Assume C to be relatively constant and ignore the interconnect resistance for the sake of simplicity.) Thus, the sensing time is directly proportional to n, R, and C. In other words, the sensing time can be adjusted by manipulating the word size, MTJ and transistor resistance, and ML capacitance respectively.

The magnitude of Vsen may be tuned such that match voltage turns ON Msen strongly, whereas mismatch keeps it OFF (or weakly ON). Note that "match" ML voltage is lower than "mismatch." However, Vsen magnitude is also tuned to maximize the difference in the discharge rate, through Msen, between match and mismatch in accordance with FIG. 3B. The figure shows that a lower Vsen is limited by a slow discharge of match and mismatch, whereas higher Vsen is limited by a fast discharge of match and mismatch.

Figure 3B:
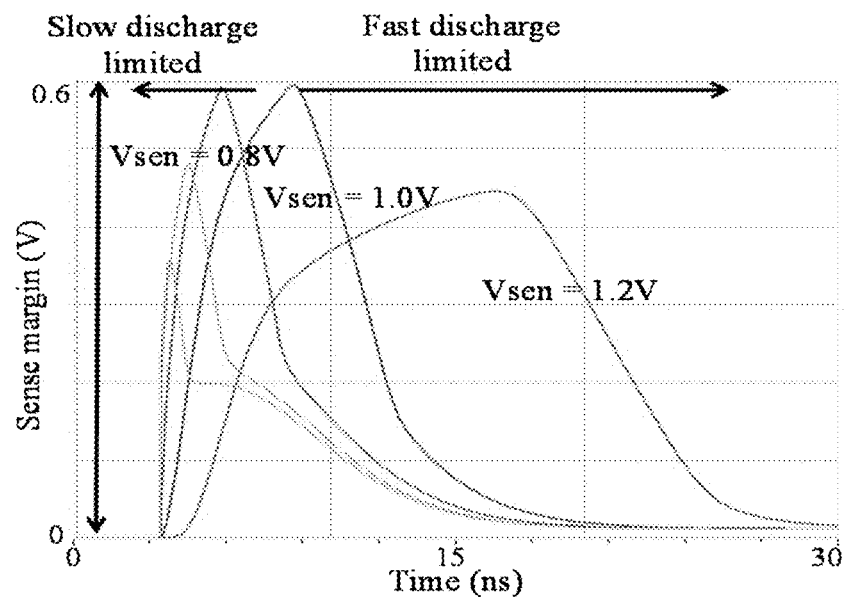
FIG. 3B shows the impact of Vsen on the sense margin.
Figure 4A:
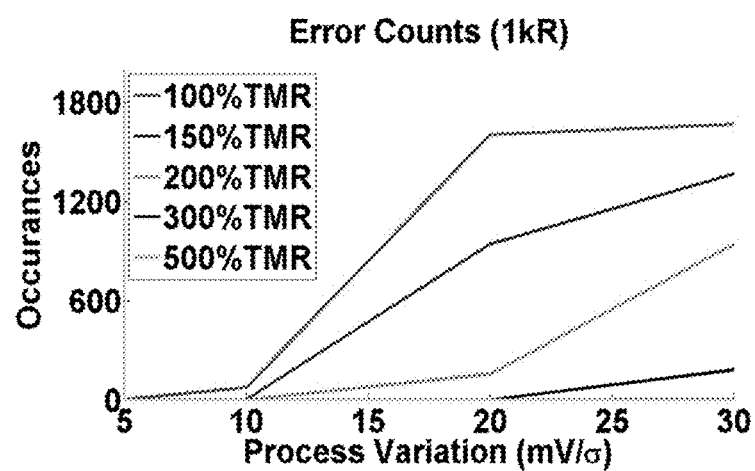
FIGS. 4A-4D show the number of search failures for a 16-bit CAM word with respect to the sigma of process variations for different $R_L$ levels.
Figure 4B:
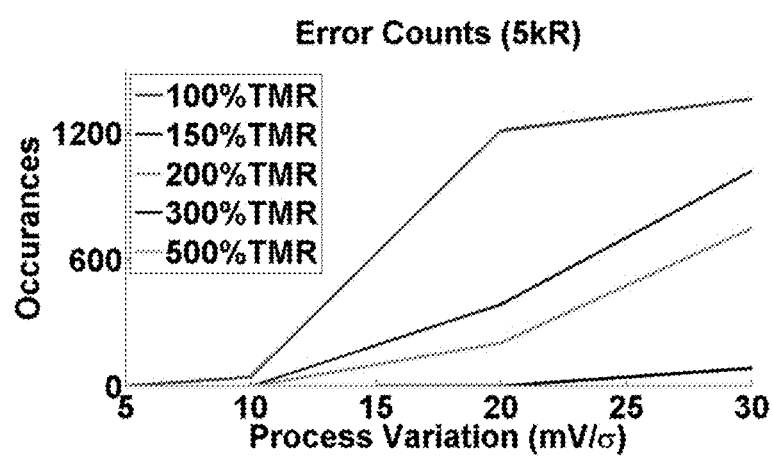
Figure 4C:
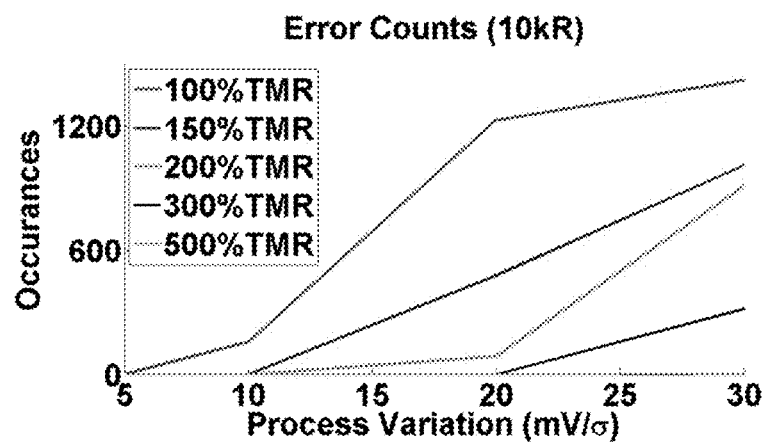
Figure 4D:
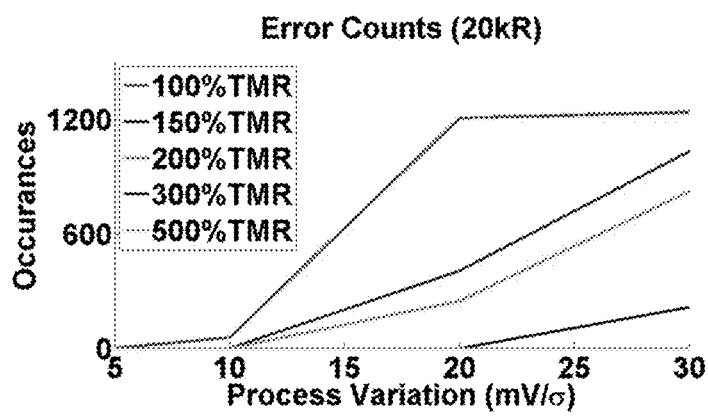

As shown in FIG. 3B, the sense margin initially increases with time. This is due to the fact that the discharge rate difference between match and mismatch cases creates more margin. However, as the ML voltage approaches Vsen, the discharge rate difference decreases until it flips when it reaches a certain point and becomes a diminishing sensing margin. Thus, an optimized sense margin may be reached when the discharge rate difference approaches zero.

The sense margin is impacted by the TMR and word size. In a "worst case operation," where all cells match except one, the difference in R between match and mismatch can be calculated as $(R_H-R_L)/nR_L$ or TMR/n, where n is the word size. Thus, the difference in R is directly proportional to TMR, and inversely proportional to the word size.

The sense margin is a function of temperature due to multiple factors: (a) threshold voltage variation of the sense transistor Msen; (b) TMR variation; and, (c) leakage of a sense transistor. Higher temperature can reduce the TMR, increasing leakage, which in turn can lower the sense margin. Low temperature can increase the threshold voltage, which may fail to turn Msen ON during mismatch, again resulting in a poor sense margin.

The CAM design contains two sources of process variation: the base resistance of MTJ, and the IDs of the pass transistors $M_1$ and $M_2$. If MTJ and the pass transistors are considered as resistors with variations $\sigma_1$ and $\sigma_2$ respectively, then the variation of a series of TCAM cells will be $\sqrt{n}\sqrt{(\sigma_1^2+\sigma_2^2)}$. If the variation is larger than $R_H-R_L$, these effects may cause a false positive on a match operation, or false negative on a mismatch operation.

Following are examples that illustrate procedures for implementing disclosed embodiments of the subject invention and/or for selecting performance parameters for various embodiments. Examples may also illustrate advantageous technical effects of the disclosed embodiments. These examples should not be construed as limiting.

As initial conditions for simulation, the design is implemented using 22 nm predictive technology. The transistor variation is modeled by lumping the variations in transistor threshold voltage ($V_{TH}$). The actual $V_{TH}$ of the transistor is the summation of $V_{TH}$ (nominal) and $\Delta V_{TH}$ (intra). The MTJ variation is modeled by varying the base resistance, and is assumed to be 5%. The simulation temperature is fixed at 298K. A total of 2000 Monte Carlo points have been simulated to observe the impact of variations. The mean of $V_{TH}$ shift is assumed to be 0 mV, whereas the standard deviation is varied from 10 mV to 30 mV. The BL and ML capacitance is assumed to be 10 fF.

The design parameters of the disclosed CAM can be analyzed by simulations which alter conditions such as: (a) word size, (b) base resistance, (c) TMR, (d) voltage, (e) temperature, and (d) transistor $V_{TH}$ variation. The word size is varied between 4-bits and 16-bits, MTJ resistance is varied between 1 KOhm to 20 KOhm, TMR is varied from 100% to 500%, supply voltage is varied from 0.5V to 1.5V, and temperature is varied from −10 C. to 90 C. Results of the simulations are shown below.

FIG. 4A-4D shows the number of search failures for a 16-bit CAM word with respect to the sigma of process variations (FIG. 4A) $R_L$=1K, (FIG. 4B) $R_L$=5K, (FIG. 4C) $R_L$=10K and (FIG. 4D) $R_L$=20K. Analysis is performed with the worst case search scenario, i.e., one-bit mismatch and full match. Failures increase with the larger $V_{TH}$ variation in the sense transistor.

Examples show that the number of failures can be reduced in various embodiments by (a) increasing the MTJ base resistance; (b) increasing the TMR; and (c) reducing the variation in sense transistor. Resistance of the MTJ is shown to depend on oxide thickness and surface area of the free layer [2]; by tuning these parameters, it is possible to obtain MTJ resistance of $R_L$=8 k$\Omega$. Experimental studies have shown that TMR could be improved up to 236% [2]. This can be used during design time to ensure sufficient TMR for proper functioning of the TCAM embodiment. The variation in the sense transistor can be reduced by upsizing it. A combination of one or more of the above principles can enable embodiments having a wider than 16-bit CAM word size.

Figure 5A:
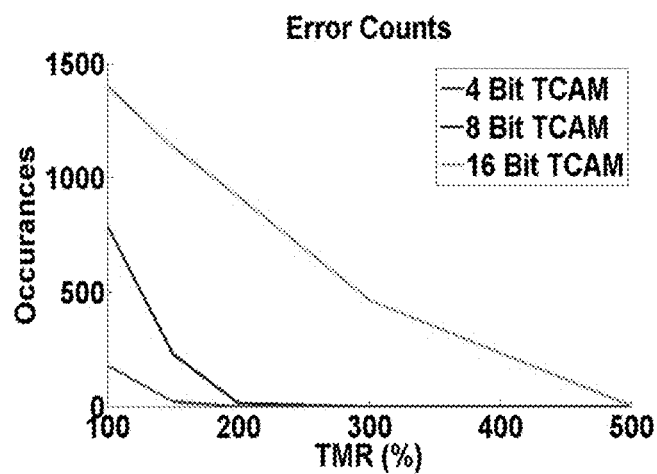
FIG. 5A compares the search failures for 4-bit, 8-bit and 16-bit CAM words.
Figure 5B:
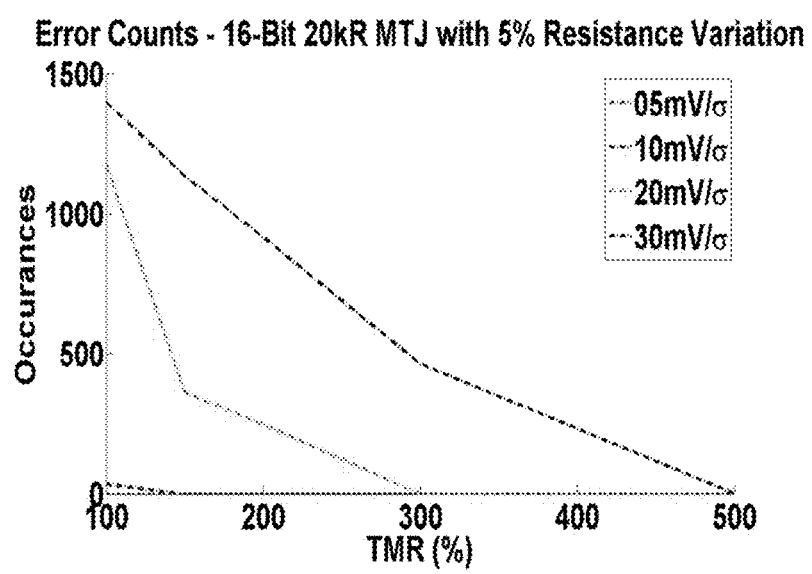
FIG. 5B shows the trend of search failures for 16-bit CAM words with respect to TMR and process variation.

FIG. 5A compares the search failures for 4-bit, 8-bit and 16-bit CAM words. It can be noted that failures are less numerous for small CAM word sizes. Although the change in resistance ($R_H-R_L$) between a match and a mismatch remains the same, the percent change is higher for smaller CAM words. Therefore, smaller word size produces more sense margin. FIG. 5B shows the trend of search failures for 16-bit CAM words with respect to TMR and process variation. Note that a 16-bit word can be sustained through a combination of ~200% TMR and larger sense transistor size (sigma<20 mV).

Figure 5C:
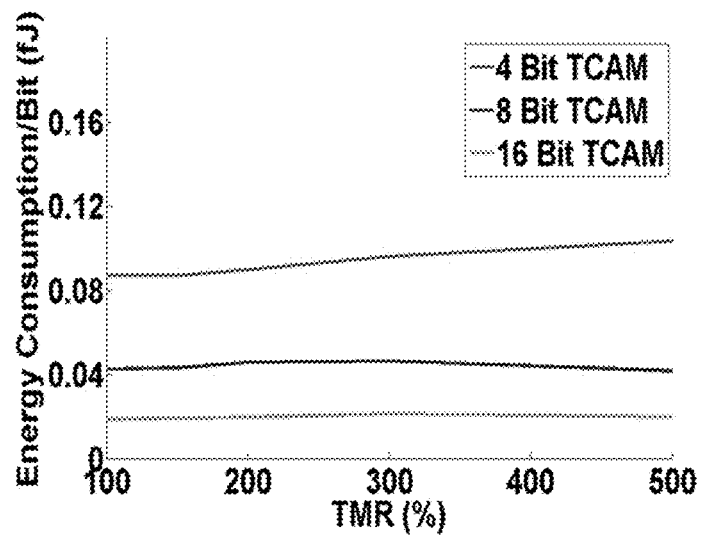
FIGS. 5C and 5D show the energy consumption per bit search energy and the search latency for different word sizes, respectively.
Figure 5D:
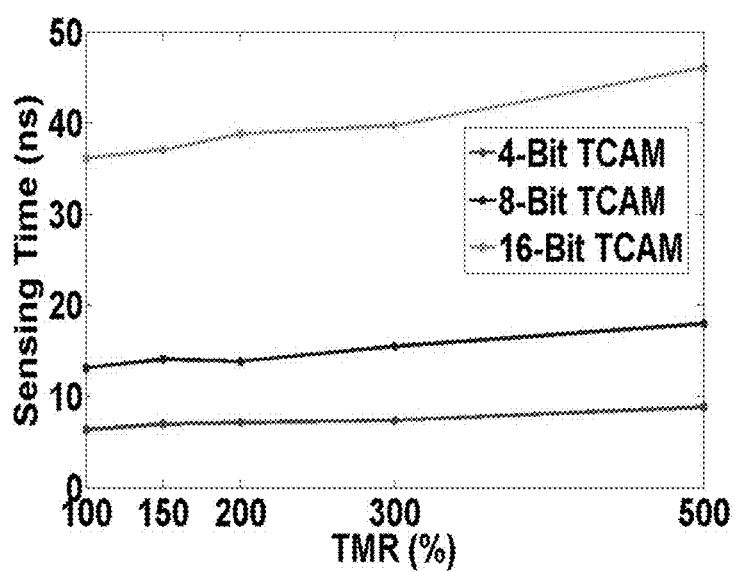

The energy consumption per bit search energy and the search latency for different word sizes is shown in FIGS. 5C and 5D. The disclosed CAM consumes less than 0.1 fJ/bit search energy. Furthermore, the energy consumed scales with word size. This is primarily due to stacked resistance that reduces the search current with word size. However, the search speed of the disclosed CAM is relatively slow, particularly for large CAM words. Therefore the disclosed CAM may be advantageous in energy-constrained environments with medium/low performance needs.

Figure 7A:
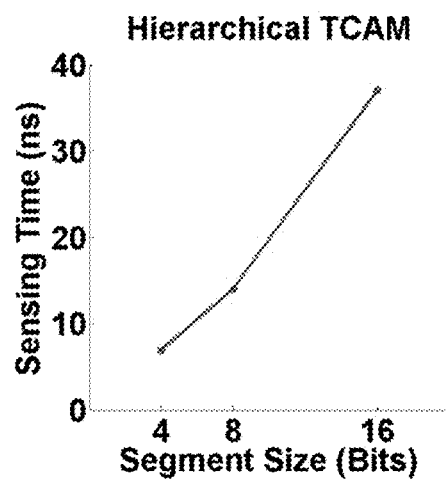
FIGS. 7A and 7B show the sense speed and search energy of a 16-bit CAM implemented using 4-bit and 8-bit hierarchical CAMs.
Figure 7B:
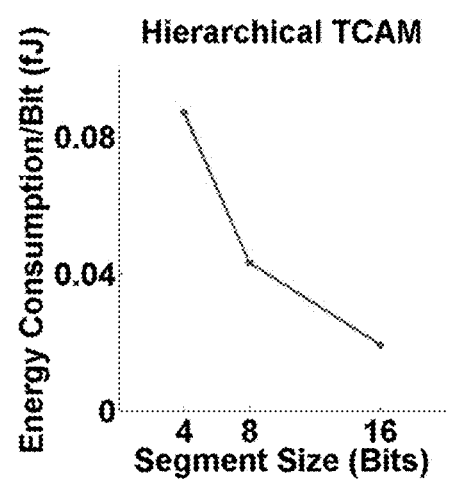

As noted, in some embodiments the speed may be improved by employing small CAM strings (4-bit or 8-bit) in parallel and use hierarchical sensing. FIGS. 7A-7B show the sense speed and search energy of a 16-bit CAM implemented using 4-bit and 8-bit hierarchically arranged CAMs. Analysis shows that the search speed can be improved by 4× at the cost of similar increase in search energy compared to single 16-bit CAM.

Figure 6A:
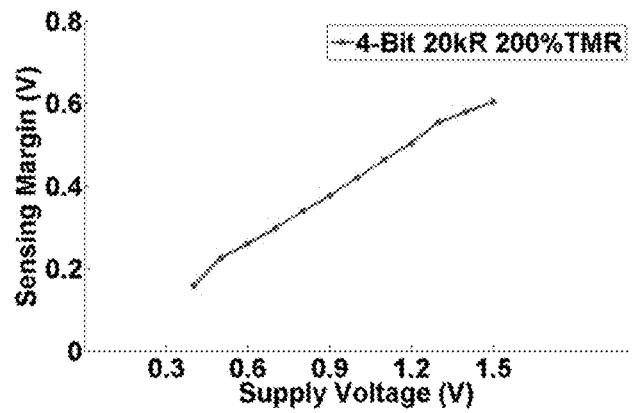
FIGS. 6A-6F compare the sensitivity of the proposed CAM over supply voltage and temperature variations.
Figure 6B:
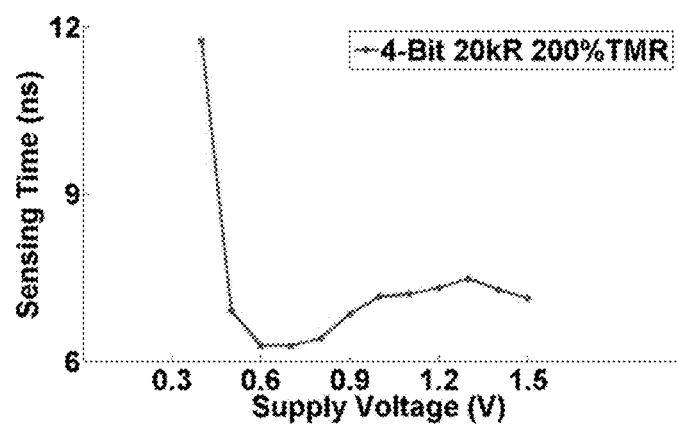
Figure 6C:
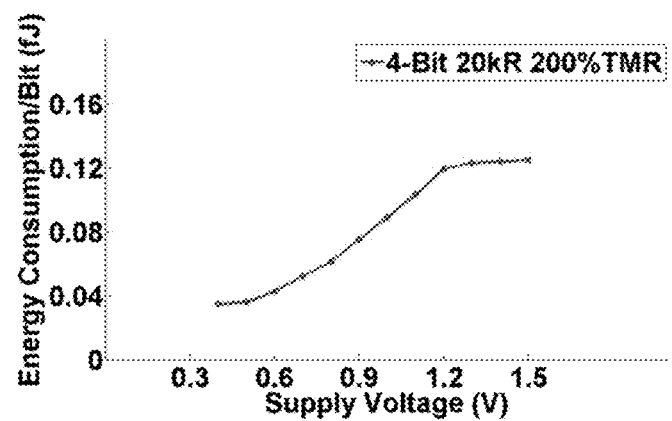

The analyses of FIGS. 6A-6F compare the sensitivity of the proposed CAM over supply voltage and temperature variations. These analyses are based on a 4-bit CAM with $R_L$=20 k$\Omega$. and TMR=200%. It can be observed that the sense margin scales linearly with voltage up until ~0.6V (FIG. 6A), whereas the sensing time remains relatively constant (FIG. 6B). Below 0.5V, the sense margin rolls off and the sensing speed decreases exponentially. The scaling of energy is plotted in FIG. 6C.

Figure 6D:
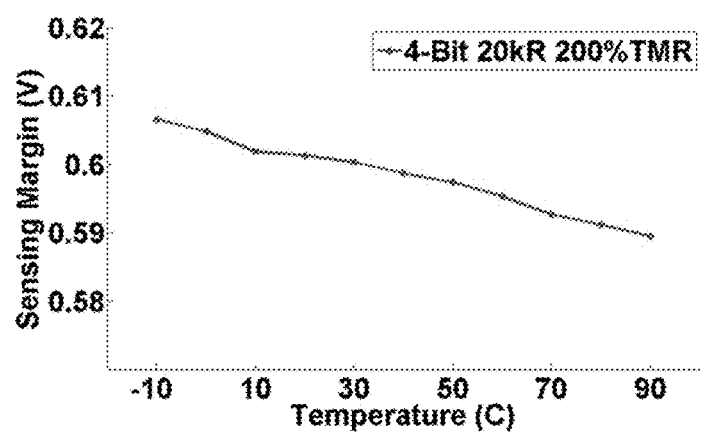
Figure 6E:
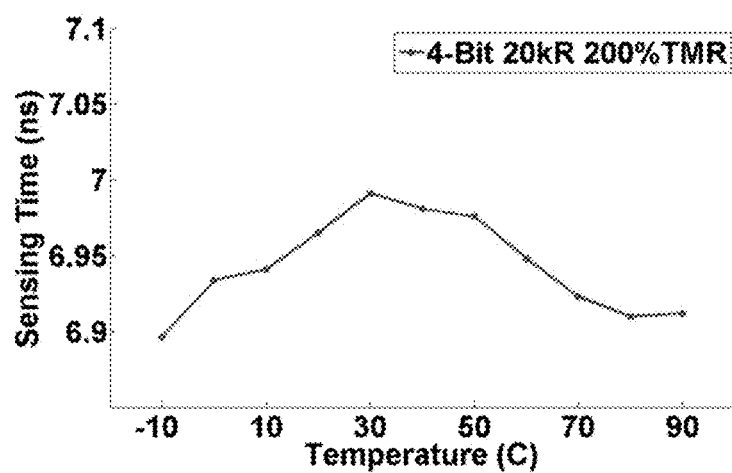
Figure 6F:
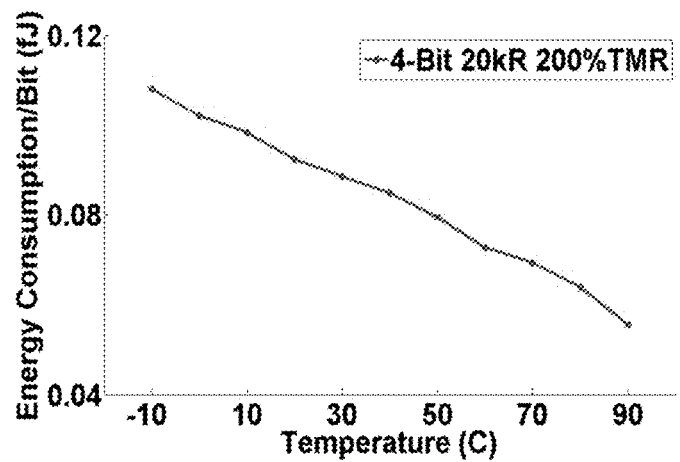

The variation of the sensing margin, search time and search energy with respect to temperature is captured in FIG. 6D-6F. It can be noted that sensing margin improves at lower temperatures. This is primarily due to lower leakage through the sense transistor. The energy consumption increases with temperature, while the sensing time remains constant.

Figure 6G:
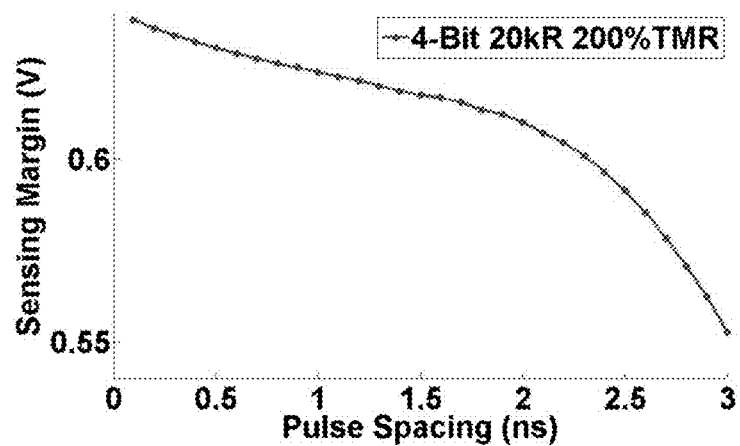
FIGS. 6G-6H show the search delay and search energy with respect to pulse spacing between the precharge and sense pulses of Vsen.
Figure 6H:
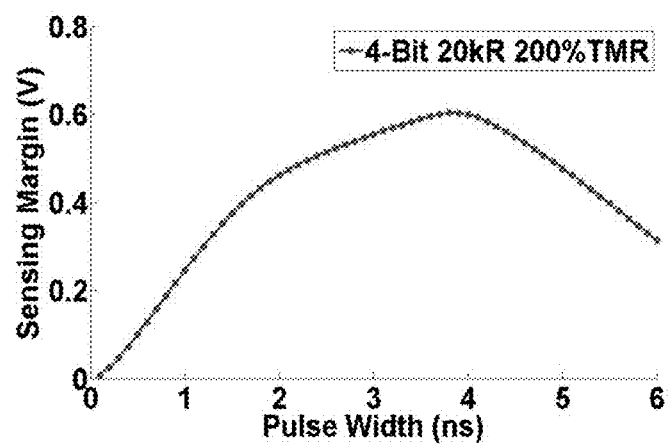

FIGS. 6G-6H show the search delay and search energy with respect to pulse spacing between the precharge and sense pulses of Vsen. It can be observed that the sensing margin initially improves with sense pulse width. This is due to the fact that discharge rate difference creates more margin between match and mismatch cases. However, very wide pulse width affects the sense margin adversely. This is due to the fact that the ML eventually discharges to ground both for match and mismatch cases.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

[1] Pagiamtzis, Kostas, and Ali Sheikholeslami. "Content-addressable memory (CAM) circuits and architectures: A tutorial and survey." Solid-State Circuits, IEEE Journal of 41, no. 3 (2006): 712-727.

[2] Shen, Weifeng, Dipanjan Mazumdar, Xiaojing Zou, Xiaoyong Liu, B. D. Schrag, and Gang Xiao. "Effect of film roughness in MgO-based magnetic tunnel junctions." Applied physics letters 88, no. 18 (2006): 182508-182508.

[3] Xu, Wei, Tong Zhang, and Yiran Chen. "Spin-transfer torque magnetoresistive content addressable memory (CAM) cell structure design with enhanced search noise margin." In Circuits and Systems, 2008. ISCAS 2008. IEEE International Symposium on, pp. 1898-1901. IEEE, 2008.

[4] Nebashi, R., N. Sakimura, Y. Tsuji, S. Fukami, H. Honjo, S. Saito, S. Miura et al. "A content addressable memory using magnetic domain wall motion cells." In VLSI Circuits (VLSIC), 2011 Symposium on, pp. 300-301. IEEE, 2011.

[5] Zhang, Yue, Weisheng Zhao, J-O. Klein, Dafiné Ravelsona, and Claude Chappert. "Ultra-High Density Content Addressable Memory Based on Current Induced Domain Wall Motion in Magnetic Track." Magnetics, IEEE Transactions on 48, no. 11 (2012): 3219-3222.

[6] Venkatesan, Rangharajan, Mrigank Sharad, Kaushik Roy, and Anand Raghunathan. "DWM-TAPESTRI—an energy efficient all-spin cache using domain wall shift based writes." In Proceedings of the Conference on Design, Automation and Test in Europe, pp. 1825-1830. EDA Consortium, 2013.

[7] K. J. Schultz, F. Shafai, G. F. R. Gibson, A. G. Bluschke, and D. E. Somppi, "Fully parallel 25 MHz, 2.5-Mb CAM," in IEEE Int. Solid-State Circuits Conf. (ISSCC) Dig. Tech. Papers, 1998, pp. 332-333.

[8] Jinil Chung, Kenneth Ramclam, Jongsun Park and Swaroop Ghosh, "Domain Wall Memory based Digital Signal Processors for Area and Energy-Efficiency", IEEE Design Automation Conference (DAC), 2015.

[9] Shoun Matsunage et al, "Standby-Power-Free Compact Ternary Content-Addressable Memory Cell Chip Using Magnetic Tunnel Junction Devices" The Japan Society of Applied Physics, 2009.

[10] Shoun Matsunage et al "Fine-Grained Power-Gating Scheme of a Metal-Oxide-Semiconductor and Magnetic-Tunnel-Junction-Hybrid Bit-Serial Ternary Content-Addressable Memory", Japanese Journal of Applied Physics, 2010.

[11] Predictive technology model. Internet: http://ptm.asu.edu.

[12] R. Micheloni, L. Crippa, A. Marelli, Inside NAND Flash Memories (Springer, New York, 2010).

[13] Chaudhary, Vikas, and Lawrence T. Clark. "Low-power high-performance NAND match line content addressable memories." Very Large Scale Integration (VLSI) Systems, IEEE Transactions on 14, no. 8 (2006): 895-905.

What is claimed is:

1. A content addressable memory cell apparatus, comprising:
   a plurality of domain-wall-based magnetic tunnel junctions (DW-MTJs) interconnected to write complementary bits, wherein a write polarity on each of the plurality of DW-MTJs is controlled by modulating a direction of current;
   a plurality of transistors;
   a plurality of searchlines;
   a wordline;
   a bitline (BL);
   a sourceline (SrL); and
   a plurality of matchlines.

2. The content addressable memory cell apparatus of claim 1, wherein a write operation is performed by turning on a first transistor of the plurality of transistors, turning off at least one of the other transistors of the plurality of transistors, and shifting the domain walls of the DW-MTJs through operations of the sourceline and the bitline.

3. The content addressable memory cell apparatus of claim 2, wherein a '0' bit-state is written by making (SrL, BL)=(1,0), and wherein an '1' bit-state is written by making (SrL, BL)=(0,1).

4. The content addressable memory cell apparatus of claim 2, wherein a search operation is performed by turning off the first transistor and placing a search value on at least two of the plurality of the search lines.

5. The content addressable memory cell apparatus of claim 4, wherein a match between the search value and a stored value is determined by a high resistance between at least two of the plurality of matchlines.

6. The content addressable memory cell apparatus of claim 4, wherein a mismatch between the search value and the stored value is determined by a low resistance between at least two of the plurality of matchlines.

7. A content addressable memory cell apparatus, comprising:
   a plurality of magnetic tunnel junctions (MTJs), wherein a write polarity on each of the MTJs is controlled by modulating a direction of current;
   a plurality of transistors;
   a plurality of searchlines;
   a wordline;
   a bitline (BL);
   a sourceline (SrL); and
   a plurality of matchlines.

8. The content addressable memory cell apparatus of claim 7, wherein a write operation is performed by turning on a first and a second transistors of the plurality of transistors, writing a '0' bit-state by making (SrL, BL)=(1,0) and an '1' bit-state by making (SrL, BL)=(0,1) via a complementary write; writing an 'X' bit-state by writing '1' to the plurality of MTJs via a parallel write.

9. The content addressable memory cell apparatus of claim 8, wherein the complementary write is performed, to at least one of the plurality of MTJs, by turning on a third transistor of the plurality of transistors and turning off a fourth transistor of the plurality of the transistors, and, to at least one of the other MTJs, by turning off the third transistor and turning on the fourth transistor.

10. The content addressable memory cell apparatus of claim 8, wherein the parallel write is performed to each of the plurality of MTJs by turning on each transistor of the plurality of transistors.

11. The content addressable memory cell apparatus of claim 7, wherein a search operation is performed by turning off the first and the second transistors and placing a search value on at least two of the plurality of the search lines.

12. The content addressable memory cell apparatus of claim 11, wherein a match between the search value and a stored value is determined by a high resistance between at least two of the plurality of matchlines.

13. The content addressable memory cell apparatus of claim 11, wherein a mismatch between the search value and the stored value is determined by a low resistance between at least two of the plurality of matchlines.

14. A method for content addressable memory (CAM) search, comprising:
   connecting a plurality of CAM cells each comprising a plurality of transistors and a plurality of domain-wall-based magnetic tunnel junctions (DW-MTJs), or connecting a plurality of ternary CAM (TCAM) cells each comprising a plurality of transistors and a plurality of magnetic tunnel junctions (MTJs), wherein the plurality of CAM cells or TCAM cells are interconnected by a matchline;

connecting a precharge transistor to one end of the interconnecting matchline;

connecting a search enable transistor to an opposite end of the interconnecting matchline;

connecting a sense transistor between the interconnecting matchline and an output node;

connecting a sense amplifier to the plurality of CAM cells or TCAM cells; and performing a search operation comprising;
   enabling the search enable transistor;
   pulsing the sense transistor with a first pulse of a precharge voltage (Vpre);
   pulsing the sense transistor with a second pulse of a sensing voltage (Vsen), wherein the sensing voltage (Vsen) turns on the sense transistor or applies a higher voltage during a search match and turns the sense transistor off or applies a lower voltage during a search mismatch with respect to the precharge voltage (Vpre); and detecting a sense margin with the sense amplifier, wherein the sense amplifier operates with a reference voltage having a value between a value of the match voltage and a value of the mismatch voltage.

15. The method of claim 14, wherein the plurality of CAM cells comprises four CAM cells.

16. The method of claim 14, wherein the plurality of CAM cells comprises eight CAM cells.

17. The method of claim 16, wherein the sense transistor size is configured such that a variation of an operating voltage of the sense transistor is smaller than 20 mV.

18. The method of claim 14, wherein the plurality of CAM cells comprises a hierarchical arrangement of segments, wherein each segment comprises four CAM cells.

19. The method of claim 14, wherein each CAM cell comprises MTJs with resistances in a range between about 1K Ohm and about 20K Ohm.

20. The method of claim 14, wherein the second pulse has a duration of about 4 ns.

\* \* \* \* \*